United States Patent
Ishii

(10) Patent No.: US 6,940,359 B2
(45) Date of Patent: Sep. 6, 2005

(54) PLL FREQUENCY SYNTHESIZER USING CHARGE PUMP

(75) Inventor: Katsuhiro Ishii, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/557,371

(22) Filed: Apr. 25, 2000

(65) Prior Publication Data

US 2003/0080817 A1 May 1, 2003

(30) Foreign Application Priority Data

Apr. 28, 1999 (JP) .......................... 11-122254

(51) Int. Cl.[7] .............................................. H03B 5/00
(52) U.S. Cl. ....................... 331/185; 331/16; 331/1 A; 327/156; 327/159
(58) Field of Search ....................... 331/1 A, 16, 185, 331/2, 74, 179, 25; 327/156, 159

(56) References Cited

U.S. PATENT DOCUMENTS

| | | | |
|---|---|---|---|
| 4,667,170 A | * 5/1987 | Lofgren et al. | 331/17 |
| 5,598,405 A | * 1/1997 | Hirose | 375/375 |
| 5,663,685 A | * 9/1997 | Kesner | 331/1 A |
| 5,900,784 A | * 5/1999 | O'Sullivan | 331/2 |
| 5,959,502 A | 9/1999 | Ovens et al. | 331/8 |
| 5,986,514 A | * 11/1999 | Salvi et al. | 331/17 |
| 6,147,532 A | * 11/2000 | Ueda | 327/158 |
| 6,150,887 A | * 11/2000 | Yamaguchi | 331/11 |

FOREIGN PATENT DOCUMENTS

| | | |
|---|---|---|
| GB | 2202700 | 9/1988 |
| GB | 2 317 279 A | 3/1998 |
| JP | 2-058932 | 2/1990 |
| JP | 3-205920 | 9/1991 |
| JP | 6-303134 | 10/1994 |
| JP | 6-342566 | 12/1994 |
| JP | 8-102662 | 4/1996 |
| JP | 8-256078 | 10/1996 |
| JP | 8-321774 | 12/1996 |
| JP | 9-064730 | 3/1997 |
| JP | 9-214335 | 8/1997 |
| JP | 9-326695 | 12/1997 |
| JP | 10004350 | 1/1998 |
| JP | 10-107628 | 4/1998 |
| JP | 10-242845 | 9/1998 |

* cited by examiner

*Primary Examiner*—Arnold Kinkead
(74) *Attorney, Agent, or Firm*—Dickstein, Shapiro, Morin & Oshinsky, LLP.

(57) ABSTRACT

In order to reduce the possibility of disturbing the drain/absorption balance of a charge pump in the PLL frequency synthesizer using the charge pump, when the output voltage and output current of the charge pump come close to their driving limits, the power supply voltage of a voltage-controlled oscillator is changed to cancel a change in input voltage of the voltage-controlled oscillator.

6 Claims, 4 Drawing Sheets

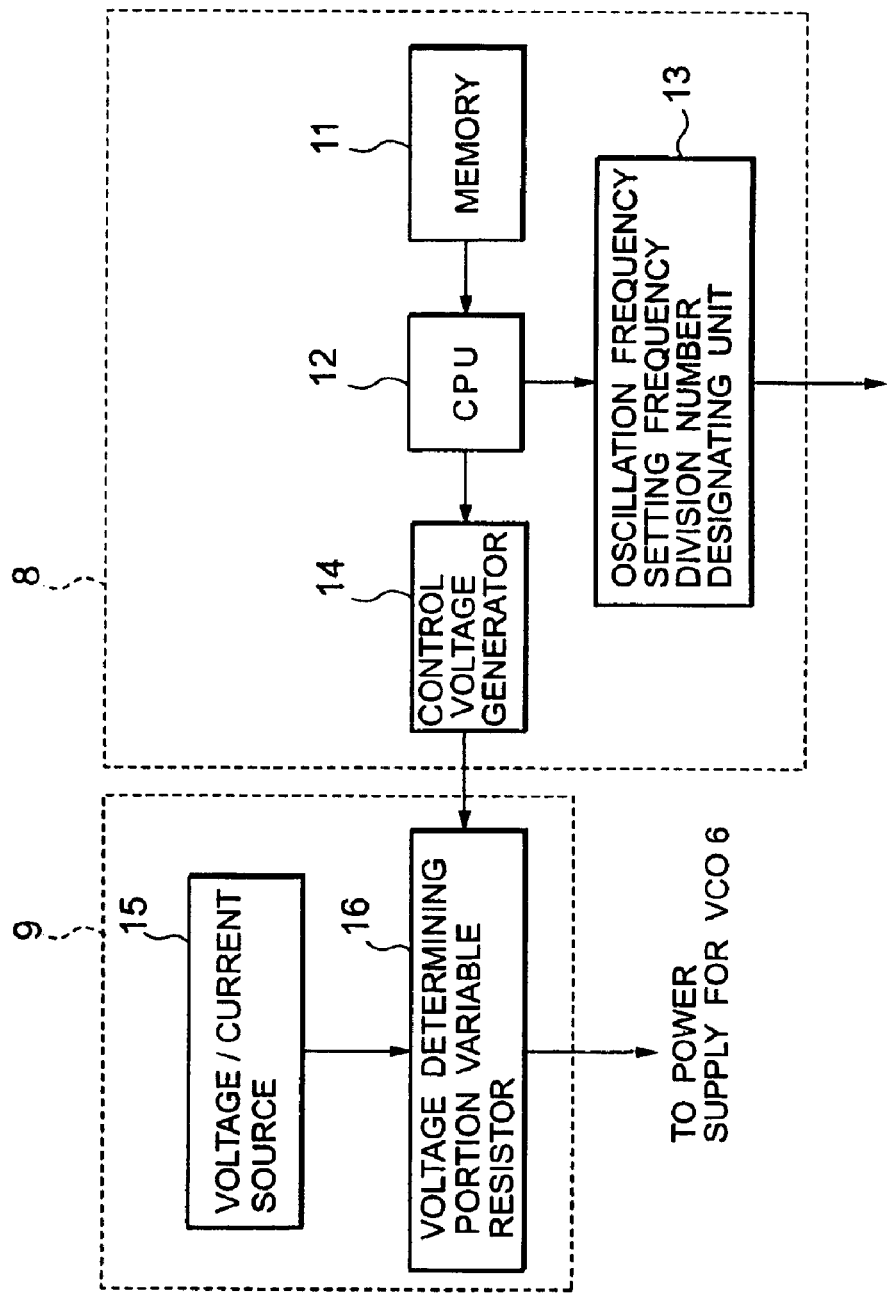

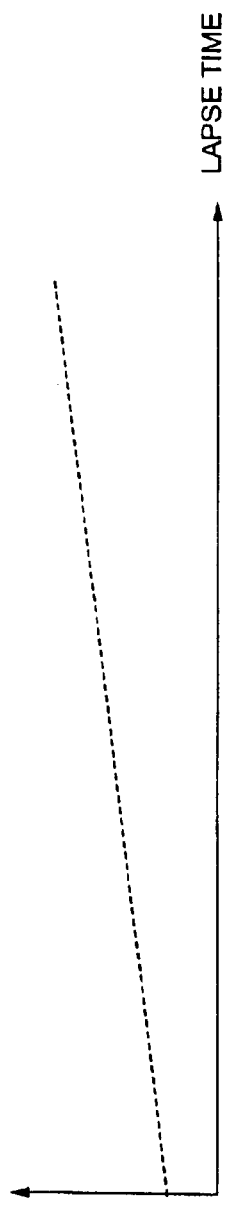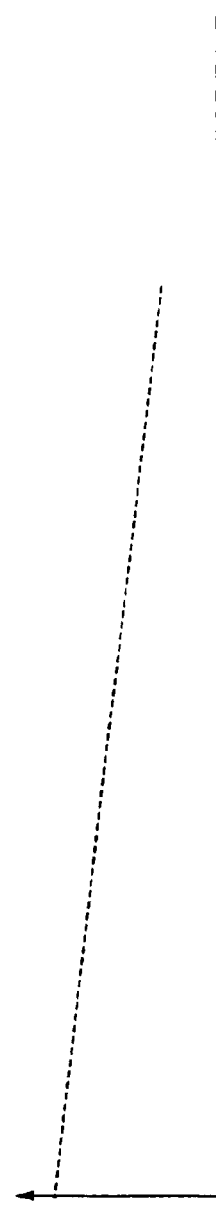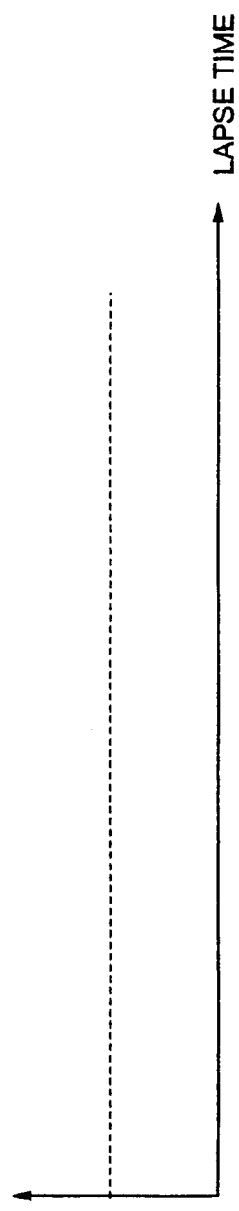

PLL FREQUENCY SYNTHESIZER USING CHARGE PUMP

BACKGROUND OF THE INVENTION

1. Field of the Invention

The present invention relates to a PLL frequency synthesizer, and more particularly to a PLL frequency synthesizer for driving a charge pump using an output from a phase comparator for comparing a phase of a frequency of a generation voltage of a voltage-controlled oscillator with a phase of a reference frequency, and driving the voltage-controlled oscillator using an output from the charge pump, thereby outputting a signal having a set desired frequency.

2. Description of the Prior Art

A generally used PLL frequency synthesizer drives a charge pump using an output from a phase comparator, and drives a VCO using an output from the charge pump. The charge pump can be driven by various methods. The mainstream current drains or absorbs current to or from the charge pump in accordance with an output from the phase comparator.

The charge pump constituted in this manner can easily increase the current value with a simple structure. However, when a voltage at the output terminal of the charge pump comes close to the power supply voltage or ground voltage, the DC bias of an element (generally using an FET) for performing drain/absorption operation upon reception of a signal from the phase comparator greatly changes to disturb the drain/absorption balance.

Japanese Unexamined Patent Publication No. 10-107628 discloses a frequency synthesizer for keeping the natural angular frequency constant by controlling the power supply of a phase comparator.

In the frequency synthesizer disclosed in Japanese Unexamined Patent Publication No. 10-107628, the power supply of the phase comparator is controlled in the above manner. However, the phase comparator itself is integrated into an IC, so it is not practical in consideration of the current popularity of synthesizer ICs to control the power supply of only the phase comparator.

SUMMARY OF THE INVENTION

The present invention has been made in view of the foregoing problems of the prior art, and has as its object to provide a PLL frequency synthesizer for reducing the possibility of disturbing the drain/absorption balance of a charge pump in the PLL frequency synthesizer using the charge pump.

In order to achieve the above object, according to a first aspect of the present invention, there is provided a PLL frequency synthesizer for driving a charge pump using an output from a phase comparator for comparing a phase of a frequency of a generation voltage of a voltage-controlled oscillator with a phase of a reference frequency, and driving the voltage-controlled oscillator using an output from the charge pump, thereby outputting a signal having a set desired frequency, characterized in that when an output voltage and an output current of the charge pump come close to driving limits, a power supply voltage of the voltage-controlled oscillator is changed to cancel a change in input voltage of the voltage-controlled oscillator.

Another aspect of the present invention lies in an arrangement in which a VCO power supply voltage setting device is added to a conventional PLL frequency synthesizer.

In the PLL frequency synthesizer having this arrangement, when the output voltage and output current of the charge pump come close to their driving limits, the power supply voltage of the VCO automatically changes to cancel a change in input voltage of the VCO. This enables the PLL to operate very stably.

In the present invention, an apparent lock range is widened by controlling the power supply voltage of the VCO using a set frequency so as not to extremely increase/decrease the output voltage of the charge pump.

In the prior art, when the control voltage of the VCO is close to the power supply voltage or ground, the VCO itself may decrease in frequency sensitivity or stop oscillating. However, the present invention can reduce the possibility of causing these phenomena.

As is clearly understood from the foregoing aspects, according to the present invention, the input voltage of the VCO can be kept almost constant regardless of the level of the oscillation frequency of the VCO.

Accordingly, the output voltage of the charge pump does not go extremely high or low. Especially in a current-driven charge pump, currents generated by drain operation and absorption operation reduce. When the PLL is steady, small currents generated by these operations also reduce. Even the output frequency deviation of the VCO 6 is expected to reduce.

Further, according to the present invention, the input voltage of the VCO does not come very close to the power supply voltage or ground. Oscillation of the VCO can be prevented from stopping, and changes in frequency sensitivity by a change in input voltage can be suppressed.

According to the present invention, the power supply of the VCO requires only simple DC control, and is hardly integrated into an IC. Therefore, this PLL frequency synthesizer is more practical than the frequency synthesizer disclosed in Japanese Unexamined Patent Publication No. 10-107628.

Japanese Unexamined Patent Publication No. 10-107628 does not describe or suggest any oscillation limit by the control voltage of the VCO. The present invention, which describes the oscillation limit in detail, has novelty.

The above and many other objects, features and advantages of the present invention will become manifest to those skilled in the art upon making reference to the following detailed description and accompanying drawings in which preferred embodiments incorporating the principle of the present invention are shown by way of illustrative examples.

BRIEF DESCRIPTION OF THE DRAWINGS

FIG. 3 is a block diagram showing the arrangements of a controller and VCO power supply voltage setting device shown in FIG. 1; and FIGS. 4A to 4C are graphs showing voltage changes at respective points in frequency switching operation, in which FIG. 4A is a graph showing an output from a charge pump, FIG. 4B is a graph showing the power supply voltage of the VCO, and FIG. 4C is a graph showing the balanced control voltage of the VCO.

DETAILED DESCRIPTION OF THE PREFERRED EMBODIMENTS

An embodiment of the present invention will be described below with reference to the accompanying drawings.

Figure 1:
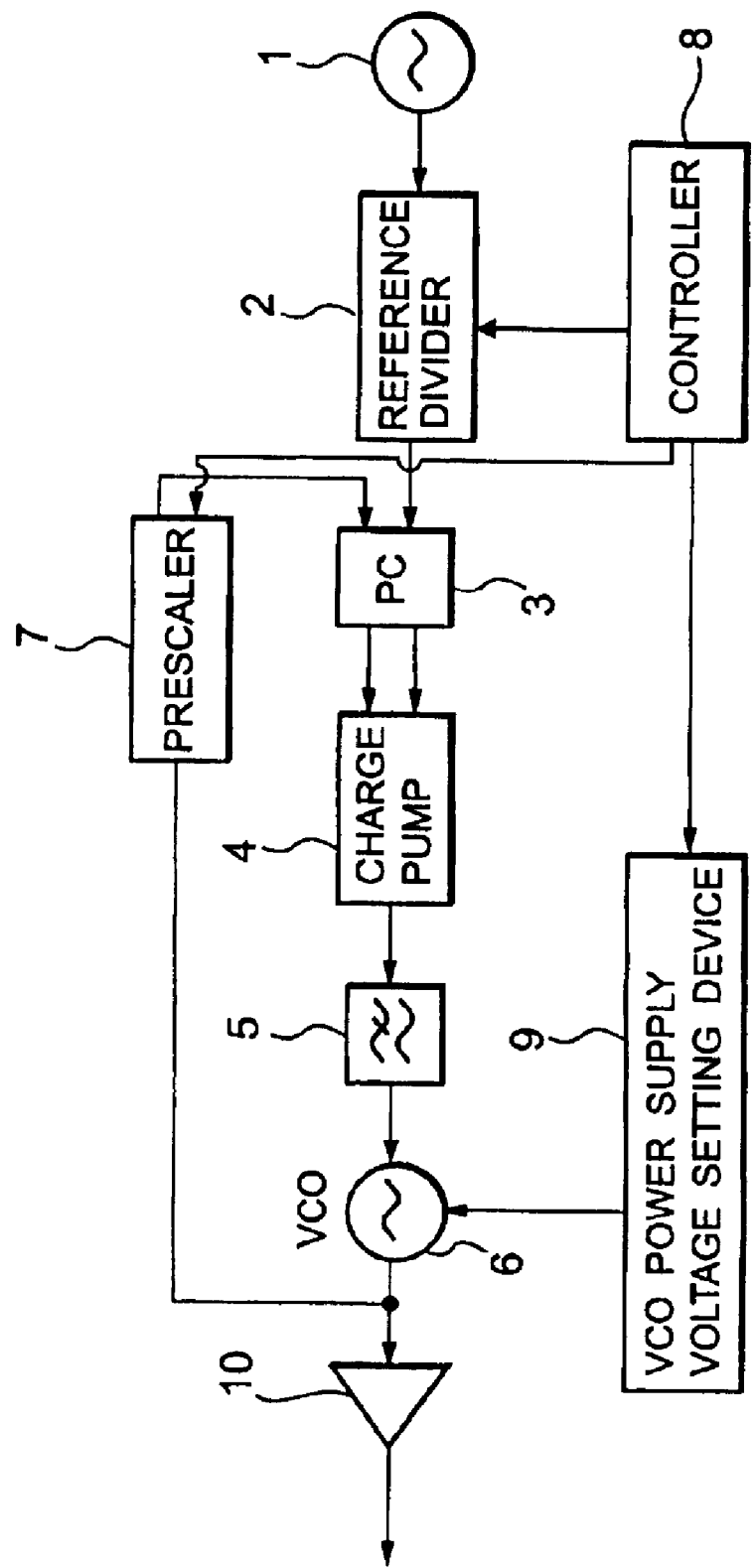
FIG. 1 is a block diagram showing the circuit of a PLL frequency synthesizer according to an embodiment of the present invention.

FIG. 1 is a block diagram showing the circuit of a PLL frequency synthesizer according to the embodiment of the present invention.

As shown in FIG. 1, this circuit comprises a reference frequency generator 1, reference divider 2, phase comparator 3, charge pump 4, low-pass filter (LPF) 5, voltage-controlled oscillator (VCO) 6, prescaler 7, controller 8, VCO power supply voltage setting device 9, and buffer amplifier 10. The circuit outputs a frequency switchable by the controller 8.

A reference signal generated by the reference frequency generator 1 is divided by the reference divider 2. The VCO 6 generates an output signal having a frequency corresponding to the voltage value of a control voltage output from the LPF 5. The generated signal branches to the buffer amplifier 10 and prescaler 7, and is frequency-divided by the prescaler 7.

The signal frequency-divided by the reference divider 2 and the signal frequency-divided by the prescaler 7 are compared by the phase comparator 3 which outputs to the charge pump 4 pulse signals proportional to the frequency difference and phase difference between the two signals.

The charge pump 4 outputs an output signal to the LPF 5 on the basis of the pulse signals output from the phase comparator 3. The LPF 5 smoothes the output signal from the charge pump 4 to remove an RF component, and controls the VCO 6 using the result. The VCO 6 outputs a variable-frequency signal in accordance with an external modulation input.

The frequency division values of the reference divider 2 and prescaler 7 are arbitrarily set by the controller 8. The VCO power supply voltage setting device 9 arbitrarily sets a power supply voltage applied to the VCO 6 under the control of the controller 8. The buffer amplifier 10 amplifies and outputs a signal from the VCO 6.

Figure 2:
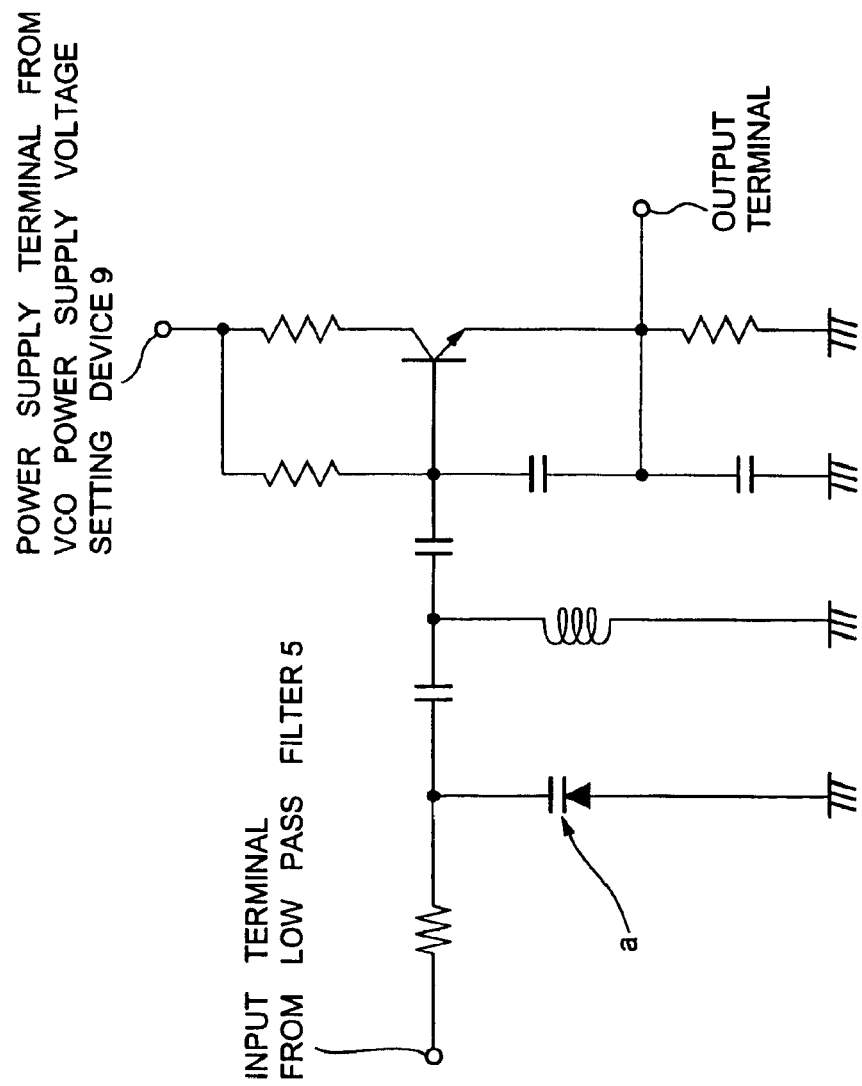
FIG. 2 is a circuit diagram showing an arrangement of a VCO shown in FIG. 1.

FIG. 2 is a circuit diagram showing an arrangement of the VCO 6 shown in FIG. 1.

The VCO 6 is a kind of modified Colpitts-Clapp oscillator. The control signal generated by the low-pass filter 5 and a power supply voltage applied from the VCO power supply voltage setting device 9 are respectively input from positions shown in FIG. 2.

In FIG. 2, reference symbol a denotes a variable-capacitance diode (varicap diode). By changing a DC bias applied to the variable-capacitance diode a, the capacitance of a capacitor component in a resonant circuit changes to change the oscillation frequency.

FIG. 3 is a block diagram showing the arrangements of the controller 8 and VCO power supply voltage setting device 9 shown in FIG. 1.

As shown in FIG. 3, the controller 8 is made up of a memory 11 storing various parameters, a CPU 12 for performing control based on parameters and the like stored in the memory 11, a control voltage generator 14 for generating a control voltage for controlling a power supply voltage generated by the VCO power supply voltage setting device 9 in accordance with an instruction from the CPU 12, and an oscillation frequency setting frequency division number designating unit 13 for setting the frequency division numbers of the reference divider 2 and prescaler 7 in accordance with an instruction from the CPU 12. The VCO power supply voltage setting device 9 is comprised of a voltage/current source 15 for generating a fundamental voltage/current, and a voltage determining portion variable resistor 16 for varying its resistance value depending on a control voltage from the control voltage generator 14.

The CPU 12 in the controller 8 calculates a VCO power supply voltage suitable for the frequency at the same time as oscillation frequency setting operation, and sends the result to the VCO power supply voltage setting device 9. A signal from the oscillation frequency setting frequency division number designating unit 13 is sent to frequency division number setting registers (neither is shown) in the reference divider 2 and prescaler 7.

The VCO power supply voltage setting device 9 sets a power supply voltage applied to the VCO 6 on the basis of information from the controller 8.

The operation of this embodiment will be explained with reference to the accompanying drawings.

When the circuit in FIG. 1 stably outputs a signal of a single frequency, the controller 8 changes the frequency division value of the reference divider 2 or prescaler 7 in order to change the frequency of the signal.

Since a difference exists between a desired frequency and the current frequency, the output of the phase comparator 3 becomes unbalanced. As a result, the output voltage of the charge pump 4 rises or drops.

In this case, the controller 8 sends a control signal to the VCO power supply voltage setting device 9 in accordance with a prospective frequency to be locked after switching. The VCO power supply voltage setting device 9 adjusts the power supply voltage of the VCO 6 in accordance with the signal.

By changing the power supply voltage of the VCO 6, the bias of the oscillator in the internal circuit changes to change the oscillation frequency. In other words, even if the control voltage from the filter 5 of the VCO 6 hardly changes, the frequency can be greatly changed.

FIGS. 4A to 4C are graphs showing voltage changes at respective points in frequency switching operation.

FIG. 4A is a graph showing an output from the charge pump 4, FIG. 4B is a graph showing the power supply voltage of the VCO 6, and FIG. 4C is a graph showing the balanced control voltage (output by filter 5) of the VCO 6. In FIGS. 4A, 4B, and 4C, the ordinate represents the voltage, and the abscissa represents the lapse time. These graphs are synchronized along the abscissa.

In the VCO 6, the control voltage from the low-pass filter 5 and the power supply voltage of the power supply voltage setting device 9 are completely independent of each other. Note that these two inputs are synchronized with each other along the time axis.

The gist of the present invention is that the control voltage of the VCO 6 does not greatly change even if the oscillation frequency changes. Therefore, if a voltage from the VCO power supply voltage setting device 9 is changed in synchronism with an output from the charge pump 4, two inputs cancel each other, and the control voltage of the VCO 6 rarely changes.

The buffer amplifier 10 mainly protects the VCO 6 from abrupt variations at the load portion of the PLL frequency synthesizer. The presence/absence of the buffer amplifier 10 is irrelevant to the gist of the present invention. In addition, this PLL frequency synthesizer may adopt a plurality of reference dividers 2 or prescalers 7.

In the embodiment shown in FIG. 1, the controller 8 assumes an intelligent system made up of a microprocessor and memory. However, the control scheme is not particularly limited.

Power supply voltage setting of the VCO 6 by the VCO power supply voltage setting device 9 assumes a continuously changeable variable resistor. However, the output frequency may exhibit discrete changes such as small, medium, and large changes.

What is claimed is:

1. A PLL frequency synthesizer which outputs a signal having a desired frequency, comprising:
    a voltage-controlled oscillator (VCO) for generating an output signal as a function of a control voltage and a power supply voltage;
    a phase comparator for comparing a phase of the output signal with a phase of a reference signal and outputting a difference signal as a function thereof; and
    a charge pump for producing the control voltage in response to the difference signal, the control voltage is being maintained within predetermined limits; and
    wherein when the control voltage changes to a value close to one of the limits thereof, the power supply voltage is modified independently of the control voltage so as to maintain the stability of the output signal from the VCO.

2. A PLL frequency synthesizer which outputs a signal having a set frequency, comprising:
    a voltage-controlled oscillator (VCO) for generating an output signal having a voltage and a frequency as a function of a control signal and a power supply signal;
    a phase comparator for comparing a phase of the output signal with a phase of a reference signal and outputting a difference signal as a function thereof; and
    a charge pump for producing the control signal in response to the difference signal, wherein the power supply signal is modified independently of the control signal to thereby widen an apparent lock range of the PLL.

3. A PLL frequency synthesizer according to claim 2, further comprising a buffer amplifier for protecting the voltage-controlled oscillator from an abrupt variation at a load portion of the PLL frequency synthesizer.

4. A radio communication apparatus comprising a PLL frequency synthesizer which outputs a signal having a desired frequency, the PLL frequency synthesizer including:
    a voltage-controlled oscillator (VCO) for generating an output signal having a voltage and a frequency as a function of a control voltage and a power supply voltage;
    a phase comparator for comparing a phase of the output signal with a phase of a reference signal and outputting a difference signal as a function thereof, and
    a charge pump for producing the control voltage in response to the difference signal, the control voltage being bound within predetermined limits; and
    wherein when the control voltage changes to a value close to one of the limits, the power supply voltage is modified independently of the control voltage so as to maintain the stability of the output signal from the VCO.

5. A radio communication apparatus comprising a PLL frequency synthesizer which outputs a signal having a set frequency, the PLL frequency synthesizer including:
    a voltage-controlled oscillator (VCO) for generating an output signal having voltage and a frequency as a function of a control signal and a power supply signal;
    a phase comparator for comparing a phase of the output signal with a phase of a reference signal and outputting a difference signal as a function thereof; and
    a charge pump for producing the control signal in response to the difference signal,
    wherein the power supply signal is modified independently of the control signal to thereby widen an apparent lock range of the PLL.

6. The radio communication apparatus of claim 5, wherein the PLL frequency synthesizer further includes a buffer amplifier for protecting the voltage-controlled oscillator from the an abrupt variation at a load portion of the PLL frequency synthesizer.

* * * * *